United States Patent
Onozawa

(10) Patent No.: US 7,608,977 B2
(45) Date of Patent: Oct. 27, 2009

(54) SURFACE-MOUNT SAW DEVICE

(75) Inventor: Yasuhide Onozawa, Kouza-gun (JP)

(73) Assignee: Epson Toyocom Corporation, Tokyo (JP)

(*) Notice: Subject to any disclaimer, the term of this patent is extended or adjusted under 35 U.S.C. 154(b) by 526 days.

(21) Appl. No.: 10/586,224

(22) PCT Filed: Nov. 12, 2004

(86) PCT No.: PCT/JP2004/016857
§ 371 (c)(1),
(2), (4) Date: Jul. 17, 2006

(87) PCT Pub. No.: WO2005/076472
PCT Pub. Date: Aug. 18, 2005

(65) Prior Publication Data
US 2007/0164637 A1    Jul. 19, 2007

(30) Foreign Application Priority Data
Feb. 5, 2004    (JP)    ............... 2004-029848

(51) Int. Cl.
H01L 41/08    (2006.01)
(52) U.S. Cl. ............... 310/313 R; 310/340; 310/348
(58) Field of Classification Search ............... 310/340, 310/348
See application file for complete search history.

(56) References Cited

U.S. PATENT DOCUMENTS

| | | | | |
|---|---|---|---|---|
| 6,319,430 B1 * | 11/2001 | Bordui et al. | ............... | 252/584 |
| 6,914,367 B2 * | 7/2005 | Furukawa | ............... | 310/340 |
| 6,969,945 B2 * | 11/2005 | Namba et al. | ............... | 310/340 |
| 7,153,487 B2 * | 12/2006 | Jundt et al. | ............... | 423/594.8 |
| 2008/0179278 A1 * | 7/2008 | Obara et al. | ............... | 216/13 |

FOREIGN PATENT DOCUMENTS

| | | |
|---|---|---|
| EP | 0893515 | 1/1999 |
| EP | 1443643 | 8/2004 |

(Continued)

OTHER PUBLICATIONS

Table 7.9 on p. 458 of a book titled *Applied Physics Handbook* 2$^{nd}$ Ed. written by Japan Society of Applied Physics and published in Japan on Apr. 25, 2002 by Maruzen Co., Ltd.

*Primary Examiner*—Jaydi SanMartin
(74) *Attorney, Agent, or Firm*—William L. Androlia; H. Henry Koda

(57) ABSTRACT

A surface-mount SAW device configured to prevent sealing resin layer coated all over the top surface of a piezoelectric substrate from becoming charged even if the piezoelectric substrate forming the SAW device is made of a pyroelectric material. The SAW device is composed of a mounting substrate; a SAW chip provided with a piezoelectric substrate, an IDT electrode formed on one surface of said piezoelectric substrate, and connection pads connected via conductor bumps to conductor traces; a flip chip mounted to the mounting substrate; and a sealing resin layer coated all over the outer surface of the SAW chip flip-chip mounted on the mounting substrate and extended down to the top surface of the mounting substrate to define an airtight space between the IDT electrode and the mounting substrate; and wherein the electrical conductivity of the piezoelectric substrate is increased to suppress charging of the sealing resin layer.

4 Claims, 2 Drawing Sheets

FOREIGN PATENT DOCUMENTS

| | | |
|---|---|---|
| JP | 3-14375 | 2/1991 |
| JP | 06006175 A * | 1/1994 |
| JP | 6-305895 | 11/1994 |
| JP | 6-305896 | 11/1994 |
| JP | 11-092147 | 4/1999 |
| JP | 2001-230095 | 8/2001 |
| JP | 2002-026687 | 1/2002 |
| JP | 2002-100945 | 4/2002 |
| JP | 2003-31711 | 1/2003 |
| JP | 3395796 | 2/2003 |
| JP | 2005-020423 | 1/2005 |
| WO | WO 03/069778 | 8/2003 |
| WO | WO 2004/002891 | 1/2004 |

* cited by examiner

SURFACE-MOUNT SAW DEVICE

TECHNICAL FIELD

The present invention relates to a surface-mount SAW (Surface Acoustic Wave) device free from various problems that arise from the use of a pyroelectric material for a piezoelectric substrate in the device of a configuration in which a SAW chip is mounted face-down on a mounting substrate by use of bumps and then sealed in an airtight space defined by the substrate surface and a sealing resin layer.

BACKGROUND ART

A surface acoustic wave device (SAW device) has a configuration in which conductor traces of comb-shaped interdigital transducer (IDT) electrodes, a reflector, connection pads and so forth are printed all over the top of a piezoelectric substrate made of crystal, lithium tantalate ($LiTaO_3$), or the like; the SAW device generates a surface acoustic wave by the application of a high-frequency electric field to the IDT electrodes, for instance, and provides filter characteristics through conversion of the surface acoustic wave into a high-frequency electric field by a piezoelectric effect.

With the widespread proliferation of a CSP (Chip Size Package) technique for semiconductor components, the CSP technique has now come into use in the manufacture of SAW devices as well for their easier miniaturization and higher productivity based on a batch manufacturing method.

The CSP-associated techniques for SAW devices are disclosed in Japanese Patent Application Laid-open No. 2002-100945.

FIG. 2 is a sectional view illustrating the SAW device configuration disclosed in Japanese Patent Application Laid-open No. 2002-100945. The illustrated SAW device A comprises: a mounting substrate 100 composed of an insulating substrate 101, external electrodes 102 mounted on the underside of the insulating substrate 101 for surface mounting use, and conductor traces 103 printed on the top of the insulating substrate 101 and connected to the external electrodes 102; a SAW chip 110 provided with a piezoelectric substrate 111, an IDT electrode 112 mounted on the one surface of the piezoelectric substrate 111, and connection pads 113 connected via conductor bumps 115 to the conductor traces 103; and a sealing resin layer 120 coated all over the SAW chip 110 flip-chip mounted on the mounting substrate 100 and extended to the top surface thereof to define an airtight space S between the IDT electrode 112 and the mounting substrate 100.

It is well-known in the art that the piezoelectric substrate 111 made of a piezoelectric material is pyroelectric which has its crystal structure belonging to any one of point groups $C_1$, $C_2$, $C_S$, $C_{2V}$, $C_4$, $C_{4V}$, $C_3$, $C_{3V}$, $C_6$ and $C_{6V}$ in terms of Schoenflies symbols (for example, Applied Physics Handbook, 2nd edition, page 458, Table 7.9). In concrete terms, for instance, lithium tantalate ($LiTaO_3$) and lithium niobate ($LiNbO_3$) belonging to the point group $C_{3V}$ and lithium tetraborate ($Li_2B_4O_7$) has pyroelectricity, whereas quartz crystal belonging to the point group $D_3$ has no pyroelectricity.

In the SAW device of FIG. 2, when the piezoelectric substrate 111 is formed of a pyroelectric material, a temperature gradient applied to the SAW device generates electric charges in the piezoelectric substrate surface by the pyroelectric effect, said electric charges causing the surface of the sealing resin layer 120 to be charged.

Charging of the CSP type SAW device mounted on an equipment circuit board will adversely affect other electronic parts placed around the SAW device.

The packing mode of SAW devices for shipping is usually what is called tape and reel packing such as shown in FIG. 3, in which SAW devices A are put in pockets 131a of a long continuous emboss carrier tape body 131 (made of polystyrene), then openings of the pockets are sealed by a PET cover tape 132 to complete an emboss carrier tape 130, and the carrier tape 130 is wound around a reel. But, when the CSP type SAW device A of FIG. 2 which uses the pyroelectric piezoelectric substrate is placed in a temperature gradient after being packed with the emboss carrier tape 130, charging of the sealing resin layer 120 causes sticking of the SAW device A to the cover tape 132 when the latter is removed, this makes it impossible to transfer of the SAW device and to place it in position and causes its dropout when it is mounted by an automatic mounting device onto a circuit board.

Further concrete examples of such disadvantages are described below.

A CSP type SAW device having a size of 2.0×1.6 mm was manufactured which had the pyroelectric piezoelectric substrate 111 made of lithium tantalate ($LiTaO_3$) and the sealing resin layer 120 made of a resinous material consisting principally of epoxy, and it was experimentally checked to see if the SAW device would stick to the cover tape 132 due to charging of the sealing resin layer. The sealing resin layer used had a relative dielectric constant of 3.2 and a volume resistivity of $1 \times 10^{16}$ Ω·cm. The thickness H of the sealing resin layer on the top surface of the SAW chip was 0.12 mm.

In the first place, the CSP type SAW device was heated at 85° C. for 5 minutes and immediately thereafter left in a 25° C. atmosphere for 2 minutes. When the SAW device was brought into contact with the cover tape 132, it was confirmed that the device stuck to the cover tape due to charging of the sealing resin layer.

Similarly, when the CSP type SAW device was heated at 85° C. for 100 hours and immediately thereafter left in a 25° C. atmosphere for 2 hours, sticking of the device to the cover tape by charging of the sealing resin layer was also confirmed.

To explore the possibility of preventing the SAW device from sticking to the cover tape by reducing the volume resistivity and relative dielectric constant of the sealing resin layer, similar experiments were conducted using sealing resin layer of a $5 \times 10^{13}$ Ω·cm volume resistivity and a 3.0 relative dielectric constant, but sticking to the cover tape could not be avoided.

Patent Document 1: Japanese Patent Application Laid-open No. 2002-100945
Patent Document 2: Japanese Patent Application Laid-open No. 11-092147
Patent Document 3: Japanese Patent Application Laid-open No. 06-305895
Non-Patent Document 1: Applied Physics Handbook, 2nd Ed., Page 458, Table 7.9 (Maruzen Co., Ltd.)

DISCLOSURE OF THE INVENTION

Problems to be Solving by this Invention

The present invention is intended to solve the above-mentioned problems, and has for its object to provide a surface-mount SAW device in which a SAW chip is mounted face-down above conductor traces of a mounting substrate through conductor bumps, resin is coated all over the top surface of the SAW chip and down to the top surface of the insulting substrate and the gap between the marginal portion of the underside of the SAW chip and the top surface of the mounting substrate is filled with resin to form an airtight space between an IDT electrode mounted on the underside of the SAW chip and the mounting substrate surface and which is configured to prevent the sealing resin layer coated all over the top surface of the piezoelectric substrate from being charged even if the piezoelectric substrate which composes a SAW device is formed of a pyroelectric material.

Means for Solving the Problems

To solve the above-mentioned problem, the invention is a surface-mount SAW device which comprises: a mounting substrate composed of an insulating substrate, external electrodes mounted on the underside of said insulating substrate for surface mounting use, and conductor traces arranged on the top of said insulating substrate and connected to said external electrodes; a SAW chip provided with a piezoelectric substrate, an IDT electrode formed on one surface of said piezoelectric substrate, and connection pads connected to said conductor traces via conductor bumps; sealing resin layer coated all over the outer surface of said flip-chip mounted SAW chip and down to the top surface of the mounting substrate to form an airtight space between said IDT electrode and said mounting substrate; in which the crystal structure of the piezoelectric substrate belongs to any one of point groups $C_1$, $C_2$, $C_S$, $C_{2V}$, $C_4$, $C_{4V}$, $C_3$, $C_{3V}$, $C_6$ and $C_{6V}$ in terms of Schoenflies symbols, which is characterized in that charging of the sealing resin layer is suppressed by increasing the conductivity of said piezoelectric substrate.

The invention is further characterized in that the conductivity of said piezoelectric substrate is increased by heating an oxidizable element while holding it in contact with said piezoelectric substrate.

The invention is still further characterized in that at least one of such metals as Fe, Zr, Al Cr, Mn, Rh, Cu, V, W, U and Sn is contained as an impurity in said piezoelectric substrate to provide increased conductivity of said piezoelectric substrate.

The invention is also characterized in that said piezoelectric substrate is made of $LiTaO_3$.

The invention is further a surface-mount SAW device which comprises: amounting substrate composed of an insulating substrate, external electrodes mounted on the underside of said insulating substrate for surface mounting use, and conductor traces arranged on the top of said insulating substrate and connected to said external electrodes; a SAW chip provided with a piezoelectric substrate, an IDT electrode formed on one surface of said piezoelectric substrate, and connection pads connected to said conductor traces via conductor bumps; sealing resin layer coated all over the outer surface of said flip-chip mounted SAW chip and down to the top of the mounting substrate to form an airtight space between said IDT electrode and said mounting substrate, in which the crystal structure of the piezoelectric substrate belongs to any one of point groups $C_1$, $C_2$, $C_S$, $C_{2V}$, $C_4$, $C_{4V}$, $C_3$, $C_{3V}$, $C_6$ and $C_{6V}$ in terms of Schoenflies symbols, which is characterized in that: said sealing resin layer has a relative dielectric constant of 3.2 or below and a volume resistivity of $1 \times 10^{16}$ Ω·cm or below; the thickness H of the sealing resin layer on the top surface of said SAW chip is 0.02 mm or above; and the conductivity of said piezoelectric substrate is increased to suppress charging of the sealing resin layer.

Effect of the Invention

As described above, according to the present invention, in the surface-mount SAW device in which the outer surface of the SAW chip mounted face-down on the mounting substrate is coated with a thermally-softened sheet of resin and the gap between the underside of the marginal portion of the SAW chip and the top surface of the mounting substrate is filled with resin to define an airtight space between the IDT electrode on the underside of the SAW chip and the top surface of the mounting substrate, the piezoelectric substrate of pyroelectricity is made conductive, a resinous material hard to become charged is chosen as the sealing resin layer, or the thickness of the sealing resin layer on the top surface of the SAW chip is chosen larger than a predetermined value, by which it is possible to prevent charging of the sealing resin layer attributable to spontaneous polarization of the piezoelectric substrate by a temperature change.

Furthermore, by setting the thickness of the sealing resin layer on the top surface of the SAW chip at a value large enough to prevent charging, it is possible to inhibit the passage therethrough of laser light for marking a product lot number on the sealing resin layer surface.

BEST MODE FOR CARRYING OUT THE INVENTION

The present invention will hereinafter be described in detail with reference to its embodiments shown in the drawings.

FIG. 1 is a longitudinal-sectional view of the surface-mount surface acoustic wave device (hereinafter referred to as a SAW device) according to an embodiment of the present invention.

The illustrated SAW device, denoted generally by 1, comprises: a mounting substrate 2 composed of an insulating substrate 3 made of glass, resin, ceramics, glassy epoxy, alumina, or the like, and external electrodes 4 provided on the underside of the insulating substrate 3 for surface mounting use, and conductor traces 5 printed on the top surface of the insulating substrate 3 and connected via internal conductors 6 to the external electrodes 4; a SAW chip 15 having connection pads 16 connected via conductor bumps 10 to the conductor traces 5 electrically and mechanically and an IDT electrode 17 electrically connected to the connection pads 16, the connection pads 16 and the IDT electrode 17 being mounted on the underside of a piezoelectric substrate 18; and a sealing resin layer 21 coated all over the SAW chip 15 (top and side surfaces thereof) except the underside thereof to define an airtight space S between the IDT electrode 17 and the top surface of the mounting substrate. The piezoelectric substrate 18 is made of a pyroelectric piezoelectric material such as lithium tantalite ($LiTaO_3$). The conductor bumps 10 are made of Au in this example, but they may be formed using a conductive adhesive, solder, or the like.

The IDT electrode 17, which forms part of the SAW chip 15, generates a surface acoustic wave by the application thereto of a high-frequency electric field from a power supply terminal, and provides filter characteristics through conversion of the surface acoustic wave into a high-frequency electric field by a piezoelectric effect.

The sealing resin layer 21 is formed by once heating a resin sheet up to its softening temperature, then applying pressure to the sheet to deform it into close contact with the outer surface of the SAW chip 15 and the top surface of the mounting substrate, and heating the deformed sheet up to its hardening temperature to immobilize the deformed sheet intact, thereby reinforcing hermeticity of the SAW chip and its fastening to the mounting substrate. The sealing resin layer 21 also serves as sealing means to provide a hermetically sealed space (an airtight space S) between the IDT electrode 17 and the top surface of the insulating substrate 3 in which to perform SAW propagation.

The present invention features suppression of charging of the top surface of the sealing resin layer 21 by increasing conductivity of the piezoelectric substrate 18 in the surface-mount SAW device 1 configured as described above.

The material for the piezoelectric substrate 18 is, for example, lithium tantalate ($LiTaO_3$), lithium niobate ($LiNbO_3$), or lithium tetraborate ($Li_2B_4O_7$) each of which belongs to one of the afore-mentioned point groups.

One possible method to provide increased conductivity of the piezoelectric substrate 18 is to heat a highly oxidizable element while holding it in contact with the piezoelectric substrate.

For example, in Japanese Patent Application Laid-open No. 11-092147 there are disclosed techniques for increasing conductivity of lithium tantalate ($LiTaO_3$) and lithium niobate ($LiNbO_3$) by reduction; with the use of a piezoelectric substrate of increased conductivity by the disclosed techniques it is possible to prevent charging of the sealing resin layer that is attributable to pyroelectricity of the piezoelectric substrate.

Alternatively, the conductivity of the piezoelectric substrate can be increased by introducing thereinto, as an impurity, at least one of such metals as Fe, Zr, Al, Cr, Mn, Rh, Cu, V, W, U and Sn in the piezoelectric substrate.

For example, in Japanese Patent Application Laid-open No. 06-305895 there is a description to the effect that lithium tantalite, even if containing many impurities, implements required characteristics of the SAW element; the impurities mentioned in the publication are mostly metals, concretely, such metal impurities as Fe, Zr, Al Cr, Mn Rh, Cu, V, W, U and Sn.

The above-mentioned publication makes no mention of the reason for which the conductivity of lithium tantalate could be increased by the metal impurities contained therein, but experiments by the inventor of this application have proved that these metal impurities also contribute to enhancement of the conductivity of the piezoelectric substrate.

Incidentally, as the material for piezoelectric substrates which are used for SAW filters and SAW duplexers in the RF stage of mobile terminals of portable telephones or the like, lithium tantalate is used, in almost all cases, because of its advantages of permitting miniaturization and low-cost production of SAW devices, but it has the defect of appreciably high pyroelectricity as compared with that of lithium niobate or lithium tetraborate; hence, there has been sought so far means for obviating the defect.

With the SAW device having a charge preventive structure according to the present invention, it is possible to effectively prevent charging of the sealing resin layer by its temperature gradient even if lithium tantalate of high pyroelectricity is used for the piezoelectric substrate.

The lithium tantalate of increased conductivity is, for example, PyroFree™ Lithium Tantalate by Silicon Light Machines, Inc. disclosed in:
http://www.siliconlight.com/htmlpgs/glvtechframes/glv-mainbody. html.

Furthermore, the present inventor has devised configurations which prevent the sealing resin layer from being charged in terms of the relative dielectric constant, volume resistivity of sealing resin layer and the thickness H of the sealing resin layer.

It was found that when the piezoelectric substrate 18 treated for high conductivity has pyroelectricity because of its crystal structure belonging to any one of point groups $C_1$, $C_2$, $C_S$, $C_{2V}$, $C_4$, $C_{4V}$, $C_3$, $C_{3V}$, $C_6$ and $C_{6V}$ in terms of Schoenflies symbols, charging of the top surface of the sealing resin layer by the influence of temperature gradient could effectively be prevented by setting the relative dielectric constant and volume resistivity of the sealing resin layer 21 at 3.2 or below and $1 \times 10^{16}$ Ω·cm or below, respectively.

Further, it became clear that charging of the sealing resin layer could be avoided by setting its thickness H on the SAW chip surface at 0.02 mm or more. With the increased thickness H of the sealing resin layer, it is also possible to inhibit the passage therethrough of laser light from a laser marker for marking a production lot number or the like.

The present invention will be described below in more detail with reference to its concrete embodiments.

EMBODIMENT 1

Lithium tantalate ($LiTaO_3$) of increased conductivity used as the material for the piezoelectric substrate 18 and the sealing resin layer 21 of a $5 \times 10^{13}$ Ω·cm volume resistivity and a 3.0 relative dielectric constant were heated at 85° C. for 5 minutes, and left in a 25° C. atmosphere for 2 minutes, followed by an experiment intended to check sticking of the sealing resin layer onto a cover tape (PET) forming an emboss carrier tape (see FIG. 3), the lithium tantalate and sealing resin layer were heated at 85° C. for 100 hours, then left in a 25° C. atmosphere for 2 hours, followed by an experiment to check sticking of the sealing resin layer onto the cover tape. In these experiments, the sealing resin layer did not stick to the cover tape—this indicates an improvement effect of preventing the sealing resin layer from being charged.

EXPERIMENT 2

To further confirm availability of the above-mentioned improvement effect, a sample of the SAW device using a piezoelectric substrate of increased conductivity and highly chargeable sealing resin layer was produced, and a similar experiment was conducted on the sample. As the result, it turned out that the higher the relative dielectric constant and the higher the volume resistivity, the easier the sealing resin layer became charged, and that the smaller the thickness H of the sealing resin layer on the top surface of the SAW chip, the easier the resin became charged. Based on these findings, a SAW device was produced in which resin of a 3.2 relative dielectric constant and a $1 \times 10^{16}$ Ω·cm volume resistivity was used as the sealing resin layer 21 and the thickness H of the sealing resin layer on the top surface of the SAW chip was 0.02 mm.

The SAW device was heated at 85° C. for 5 minutes and immediately left in a 25° C. atmosphere for 2 minutes, after which the resin layer on the top of the SAW device was brought into contact with a PET-made cover tape to check for electrostatic adsorptive activity of the resin layer; no sticking of the SAW device by charging of the sealing resin layer was observed.

However, when a resin of a dielectric constant exceeding 3.2 and a volume resistivity exceeding $1 \times 10^{16}$ Ω·cm was used as the sealing resin layer 21, or when the thickness H of the sealing resin layer on the top surface of the SAW chip was smaller than 0.02 mm, sticking by charging of the sealing resin layer was observed.

The above revealed that it is effective in preventing the sealing resin layer from being charged that: the relative dielectric constant is 3.2 or below; the volume resistivity is $1 \times 10^{16}$ Ω·cm or below; and the thickness H of the sealing resin layer on the top surface of the SAW chip is 0.02 mm or more.

EXPERIMENT 3

Next, a SAW device, which used a piezoelectric substrate made of a lithium tantalate ($LiTaO_3$) material of increased conductivity, was heated at 85° C. for 100 hours and then immediately left in a 25° C. for 2 hours, in which case no sticking to the cover tape due to charging of the sealing resin layer was observed.

Further, a SAW device, which used a piezoelectric substrate made of a lithium tantalate material of increased conductivity, was heated at 260° C. for 1 minute and then immediately left in a 25° C. for 2 minutes; in this case, too, no sticking to the cover tape due to charging of the sealing resin layer was observed.

EMBODIMENT 4

Next, experiments were conducted for various adjustments of the thickness H of the sealing resin layer. That is, in the case of marking a production lot number on the top surface of the sealing resin layer 21 of the SAW device 1 by means of a laser marker, when the thickness H of the sealing resin layer on the SAW chip 15 is too small, laser light may sometimes pass through the sealing resin layer and strike directly on the top surface of the SAW chip, resulting in a breakdown of the SAW chip. In an experiment for overcoming the disadvantage, in the case of manufacturing a 2.0×1.6 mm size SAW device using sealing resin layer of a $1\times10^{16}$ Ω·cm volume resistivity and a 3.2 relative dielectric constant, the thickness H of the sealing resin layer on the top of the SAW chip was set at 0.12 mm and the piezoelectric substrate 18 was formed of a lithium tantalate material of increased conductivity. When the top surface of the sealing resin layer of the SAW device was subjected to laser engraving, marking was conducted to a depth of 0.08 mm from the sealing resin layer surface and laser light did not pass through the sealing resin layer. Since the thickness H of the sealing resin layer on the SAW chip surface was larger than 0.02 mm, charging of the sealing resin layer could be prevented.

Experiments similar to those mentioned above in the embodiment were actually performed, and then sticking of the SAW devices to the cover tape due to charging of the sealing resin layer did not ever occur.

Incidentally, an increase in the thickness H of the sealing resin layer on the SAW chip heightens the more the antistatic control effect accordingly, but since too much thickness will go against the needs for miniaturization and weight saving of SAW devices, the thickness H needs to be selected suitably.

Since charging of the sealing resin layer can be avoided by increasing the conductivity of the pyroelectric piezoelectric substrate, it was also confirmed that charging could be prevented also when the SAW device was mounted on the circuit board. Hence, it is possible to prevent an adverse influence on surrounding electronic components on the circuit board which is a defect of the prior art.

EXPLANATION OF THE CODES

Figure 1:
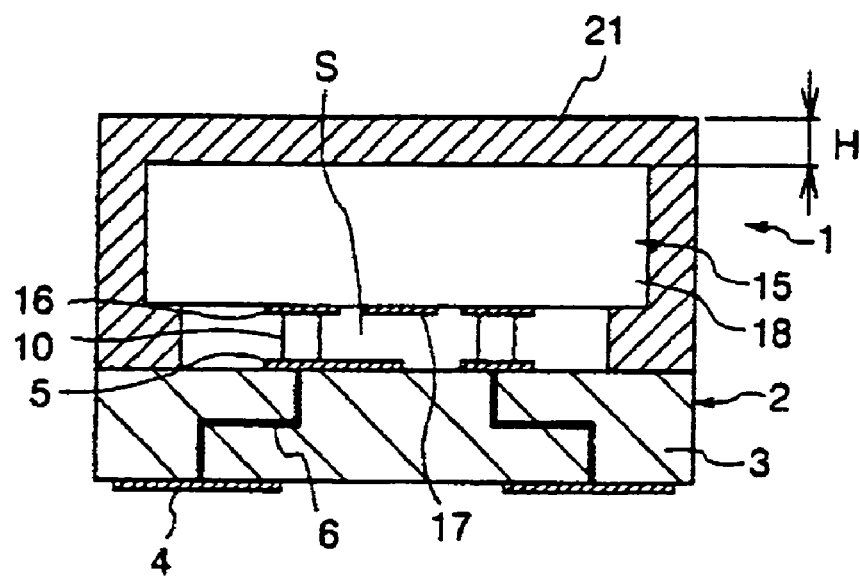
[FIG. 1] Longitudinal-sectional view of the surface-mount surface acoustic wave device according to one embodiment of the present invention.
Figure 2:
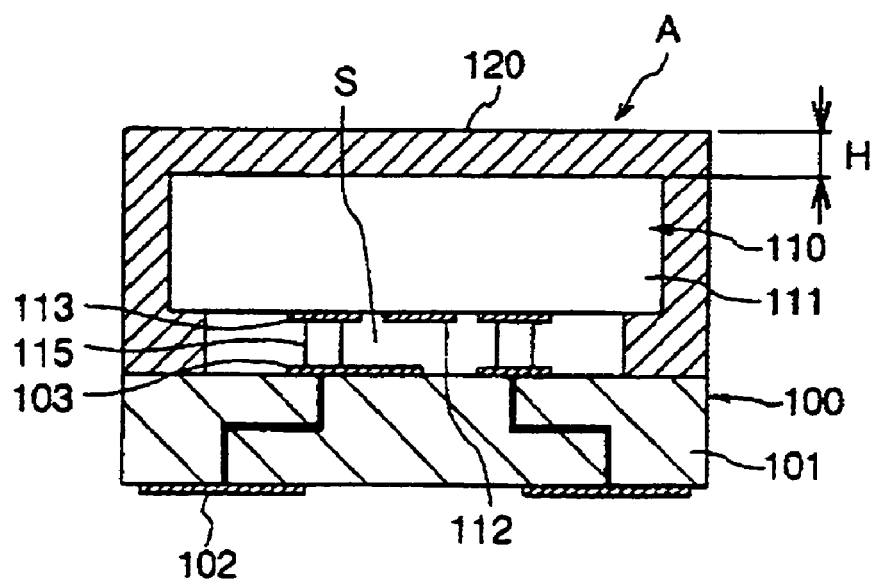
[FIG. 2] Longitudinal-sectional view of a conventional surface-mount surface acoustic wave device.
Figure 3:
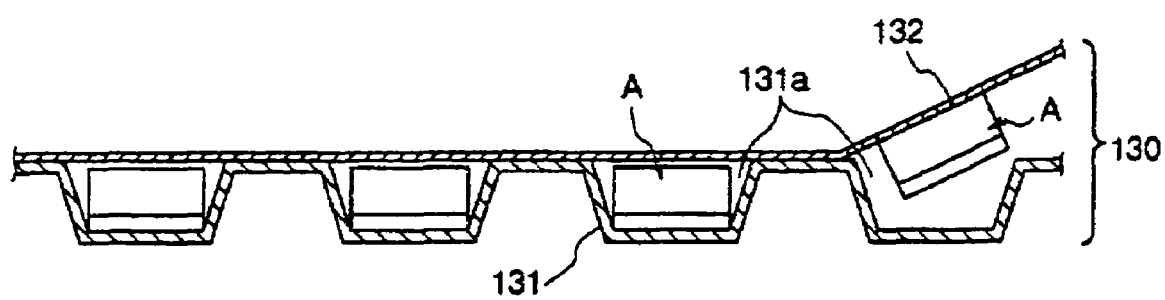
[FIG. 3] Diagram for explaining a defect of the prior art example.

1: SAW device; 2: Mounting substrate; 3: Insulating substrate; 4: External electrodes; 5: Conductor traces; 6: Inner conductor; 10: Conductor bumps; 15 SAW chip(s); 16: Connection pads; 17: IDT electrode; 18: Piezoelectric substrate; 21: Sealing resin layer.

The invention claimed is:

1. A surface-mount SAW device comprising:
   a mounting substrate composed of an insulating substrate, external electrodes mounted on the underside of said insulating substrate for surface mounting use, and conductor traces arranged on the top of said insulating substrate and connected to said external electrodes;
   a SAW chip provided with a piezoelectric substrate, an IDT electrode formed on one surface of said piezoelectric substrate, and connection pads connected to said conductor traces via conductor bumps and flip chip mounted on said mounting substrate; and
   sealing resin layer coated all over the outer surface of said flip-chip mounted SAW chip and down to the top surface of the mounting substrate to form an airtight space between said IDT electrode and said mounting substrate;
   wherein the crystal structure of the piezoelectric substrate belongs to any one of point groups $C_1$, $C_2$, $C_S$, $C_{2V}$, $C_4$, $C_{4V}$, $C_3$, $C_{3V}$, $C_6$ and $C_{6V}$ in terms of Schoenflies symbols;
   characterized in that:
   said sealing resin layer has a relative dielectric constant of 3.2 or below and a volume resistivity of $1\times10^{16}$ Ω·cm or below;
   the thickness H of the sealing resin layer on the top surface of said SAW chip is 0.02 mm or above; and
   electrical conductivity of said piezoelectric substrate is increased to suppress charging of the sealing resin layer.

2. The surface-mount SAW device of claim 1, characterized in that the electrical conductivity of said piezoelectric substrate is increased by heating an oxidizable element while holding it in contact with said piezoelectric substrate.

3. The surface-mount SAW device of claim 1, characterized in that at least one metal selected from the group consisting of Fe, Zr, Al Cr, Mn, Rh, Cu, V, W, U and Sn is contained as an impurity in said piezoelectric substrate to provide increased electrical conductivity of said piezoelectric substrate.

4. The surface-mount SAW device of any one of claims 2 or 3, characterized in that said piezoelectric substrate is made of $LiTaO_3$.

* * * * *

UNITED STATES PATENT AND TRADEMARK OFFICE
CERTIFICATE OF CORRECTION

PATENT NO. : 7,608,977 B2 Page 1 of 1
APPLICATION NO. : 10/586224
DATED : October 27, 2009
INVENTOR(S) : Yasuhide Onozawa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 628 days.

Signed and Sealed this

Twelfth Day of October, 2010

David J. Kappos
*Director of the United States Patent and Trademark Office*